United States Patent [19]
Zhao

[11] Patent Number: 6,071,809
[45] Date of Patent: Jun. 6, 2000

[54] METHODS FOR FORMING HIGH-PERFORMING DUAL-DAMASCENE INTERCONNECT STRUCTURES

[75] Inventor: Bin Zhao, Irvine, Calif.

[73] Assignee: Rockwell Semiconductor Systems, Inc., Newport Beach, Calif.

[21] Appl. No.: 09/161,176

[22] Filed: Sep. 25, 1998

[51] Int. Cl.[7] .............................................. H01L 21/4763
[52] U.S. Cl. ....................... 438/634; 438/624; 438/637; 438/622; 438/631; 438/633; 438/645
[58] Field of Search ..................................... 438/634, 622, 438/623, 626, 627, 629, 631, 633, 637, 643, 645

[56] References Cited

U.S. PATENT DOCUMENTS

| | | | |
|---|---|---|---|
| 4,789,648 | 12/1988 | Chow et al. | 438/633 |
| 5,663,101 | 9/1997 | Cronin | 438/637 |
| 5,736,457 | 4/1998 | Zhao | 438/634 |
| 5,741,626 | 4/1998 | Jain et al. | 438/634 |
| 5,821,168 | 10/1998 | Jain | 438/692 |

Primary Examiner—Wael Fahmy
Assistant Examiner—Hsien-Ming Lee
Attorney, Agent, or Firm—Snell & Wilmer, LLP

[57] ABSTRACT

Dual damascene methods and structures are provided for IC interconnects which use a dual-damascene process incorporating a low-k dielectric material, high conductivity metal, and an improved hard mask scheme. A pair of hard masks are employed: a silicon dioxide layer and a silicon nitride layer, wherein the silicon dioxide layer acts to protect the silicon nitride layer during dual damascene etch processing, but is subsequently sacrificed during CMP, allowing the silicon nitride layer to act as a the CMP hard mask. In this way, delamination of the low-k material is prevented, and any copper-contaminated silicon dioxide material is removed.

17 Claims, 7 Drawing Sheets

SINGLE DAMASCENE

DUAL DAMASCENE

METHODS FOR FORMING HIGH-PERFORMING DUAL-DAMASCENE INTERCONNECT STRUCTURES

TECHNICAL FIELD

The present invention relates, generally, to methods and structures for improving the fabrication of multilevel interconnects in integrated circuits and, more particularly, to a dual damascene, low-k dielectric process employing an improved hard-mask scheme.

BACKGROUND ART AND TECHNICAL PROBLEMS

Through advanced semiconductor processing techniques, integrated circuit devices with submicron and sub-half-micron features sizes can now be manufactured. This trend toward deep submicron technology (i.e., involving feature sizes less than 0.35 microns) has, in turn, driven the need for multilayer interconnects. As a result, circuit performance in the deep submicron regime is increasingly a function of the delay time of electronic signals traveling between the millions of gates and transistors present on the typical integrated circuit chip. Parasitic capacitance and resistance effects resulting from these otherwise passive interconnect structures must therefore be well-controlled. Toward this end, recent trends emphasize the use of low resistance metals (e.g., copper) in conjunction with insulating materials with low dielectric constants ("low-k dielectrics") between metal lines. A low-k dielectric is a dielectric material which exhibits a dielectric constant substantially less than conventional dielectric materials such as silicon dioxide, silicon nitride, and silicon oxynitride. Silicon dioxide, for example, has a dielectric constant of about 4.0. Copper is desirable in that its conductivity is relatively high and it is less susceptible to electromigration failure than many metals (for example, aluminum).

Optical lithography techniques have, for the most part, managed to keep pace with deep submicron requirements through the use of off-axis illumination, phase shifting masks, and other methods known in the art. However, the decreasing depth of focus that accompanies this increase in resolution requires the production of highly planar surfaces during intermediary process steps. In light of the need for highly planar surfaces, traditional metal deposition and photolithographic techniques become progressively more ineffective as line widths are scaled down and multiple layers of metal are used. For example, traditional metal deposition techniques can result in poor metal step coverage along the edges of the contact openings. Furthermore, wet chemical etch processes typically used with metals are difficult to control. While dry plasma etching may be employed with many metals, other metals with highly desirable properties (e.g., copper and gold) are generally not amenable to dry etching.

Modern semiconductor processing techniques increasingly employ Chemical-Mechanical Polishing (CMP) in the fabrication of interconnect layers, particularly where the number of layers rises above three and the conductive lines themselves are characterized by a high aspect ratio (e.g., lines on the order of 0.25 $\mu$m in width and on the order of 1.0 $\mu$m in height). In a paradigmatic CMP process, a resinous polishing pad (e.g., a polyurethane pad) is employed in conjunction with a mechanically and chemically active slurry. When pressure is applied between the polishing pad and the wafer being polished, mechanical stresses are concentrated on the exposed edges of the adjoining cells in the cellular pad. Abrasive particles within the slurry concentrated on these edges tend to create zones of localized stress at the workpiece in the vicinity of the exposed edges of the polishing pad. This localized pressure creates mechanical strain on the chemical bonds comprising the surface being polished, rendering the chemical bonds more susceptible to chemical attack by the slurry. Thus, with the correct choice of slurry, pressure, and other process conditions, a highly planar surface may be formed on the wafer.

A fabrication method which employs CMP techniques and which addresses many of the above concerns is the so-called "damascene" process. Damascening acquired its name from an ornamental technique, generally attributed to metal-workers in ancient Damascus, which involved scribing or incising patterns into steel (most often swords) then filling the resulting grooves with gold or silver prior to final polish. Similarly, the modern semiconductor analog of this process involves, in the broadest sense, forming patterns in a dielectric layer, filling the resulting pattern with interconnect metal, then polishing away the excess metal on the wafer surface and leaving inlaid interconnect metal features.

There are two major classes of damascene processes: single-damascene and dual-damascene. These two processes are illustrated in highly simplified form in FIGS. 1A and 1B (details of the various intermediary steps are discussed in further detail below). Briefly, and with reference to FIG. 1A, a single damascene process involves making contact to a lower conductor 102 (formed, for example, on substrate 107) by patterning dielectric layer 106 and forming a conductive plug 104 in dielectric layer 106, then patterning a second dielectric layer 110 and forming the actual interconnect wiring metallization 108 in patterned dielectric layer 110. In a dual-damascene process (FIG. 1B), the interconnect wiring 108 and plug 104 are formed by patterning both the via and the trench patterns into dielectric 106, then filling them simultaneously with metal. The dual damascene process offers the advantages of process simplification and low manufacturing cost.

The use of Cu as interconnect metal in IC devices gives rise to many difficulties and challenges. For example, as is well known, placing copper in contact with silicon or silicon dioxide can lead to disastrous results. Specifically, copper tends to migrate or diffuse into the silicon dioxide, where it acts to increase leakage currents or actually short-out adjacent conductors. In addition, once Cu diffuses through the silicon dioxide and reaches the silicon devices, the device will generally malfunction in some manner. This has motivated the semiconductor industry to form diffusion barriers around any copper conductors present in the structure. The inner surfaces (i.e., the bottom and sides of the via and trench) are typically coated with a thin layer of Ti, TiN, Ta, TaN, WN or another adequate barrier metal. The top surface of a Cu conductor, however, is more difficult to deal with, as connections must be made to the top of the conductor during subsequent process steps. As a result, copper conductors are typically capped with a layer of silicon nitride after the inlaid Cu conductors are formed by CMP. Silicon nitride is desirable in that it is an effective diffusion barrier to copper and is well characterized from a processing standpoint.

As it is necessary in a dual-damascene approach to etch through the silicon nitride cap barrier layer to form a good electrical connection between the via metal and the previous level of Cu wiring, it is difficult to use silicon nitride for other purposes within the structure because these structures would necessarily be removed along with the silicon nitride cap layer material during etching. For example, it is desirable to use a "hard mask" to cover low-k dielectrics and other areas requiring protection during metal CMP. As the metal is polished away, the hard mask (typically a dielectric material) acts as a mechanical polishing stop to prevent undesirable damage to the underlying structures.

Silicon dioxide is often used as a hard mask material for the reasons set forth above with respect to the silicon nitride cap barrier layer. More particularly, it is necessary to choose a hard mask material which is different from the cap barrier layer material since the former would be removed during processing. Thus, silicon dioxide has been and continues to be the most popular choice. Unfortunately, silicon dioxide is known to exhibit a relatively high erosion rate during metal CMP. This has caused a variety of problems with respect to dual damascene copper interconnects employing low-k dielectrics. Most notably, when the oxide hard mask erodes away, the low-k material tends to delaminate or break off from the underlying structures, causing catastrophic failure.

More particularly, referring now to FIG. 2A, a typical prior art low-k dual-damascene structure (prior to metal CMP) includes copper conductors 204 formed on a substrate 202 with a dielectric (e.g., silicon dioxide or a low-k dielectric) 206. A nitride cap layer 208 is formed on copper conductors 204, which is followed by a low-k dielectric layer 210, an etch stop silicon dioxide layer 212, a second low-k dielectric layer 216, and a hard mask silicon dioxide layer 220. Using standard etching techniques, vias 228 and trenches are patterned in the low-k dielectrics, and the copper interconnect metal 230 and any seed and barrier layers are deposited to form the connection to conductor 204.

Note that, in accordance with currently known methods, cap layer 208 consists of silicon nitride and hard mask layer 220 consists of silicon dioxide. As mentioned above, the choice of silicon nitride for cap layer 208 is dictated by the need for a copper barrier, and the choice of silicon dioxide for hard mask layer 220 is based on the need to employ a material with high etch selectivity with respect to cap layer 208 (i.e., in order to etch away the silicon nitride at the bottom of via 228 without removing hard mask 220).

Referring now to FIG. 2B, which depicts the low-k structure after metal CMP, the disadvantages of this system become clear. As mentioned briefly above, silicon dioxide layer 220 exhibits poor erosion resistance to metal CMP, and thus can become extremely thin or can be removed entirely. As a result, much of the shear and other stresses arising during CMP are imparted to the underlying low-k structure; i.e., low-k layer 216. In general, low-k dielectric materials such as any of the various polymeric materials are not able to withstand CMP stresses. In addition, these low-k materials are not chemically compatible with the slurry used in Cu metal CMP. The low-k materials tend to be attacked and damaged by the slurry chemicals. Thus, it is quite common for low-k layer 216 to delaminate or separate from the underlying structure. Furthermore, even in the case where a significant thickness of oxide 220 remains after metal CMP, this oxide material may be contaminated with copper, which can affect long term reliability of the system.

This problem has emerged as a major challenge facing manufacturers seeking to develop high reliability, high performance integrated circuits. Accordingly, methods and structures are needed in order to overcome these and other limitations in the prior art.

SUMMARY OF THE INVENTION

The above disadvantages of the prior art may be addressed by an improved dual-damascene process. Methods and structures according to various aspects of the present invention provide techniques for fabricating IC interconnects using a dual-damascene process which incorporates a low-k dielectric material, high conductivity metal, and an improved hard mask scheme. In accordance with one aspect of the present invention, a stack of hard masks are employed. For example, in a two-layer stack, a silicon dioxide layer and a silicon nitride layer are formed, wherein the silicon dioxide layer acts to protect the silicon nitride layer during dual damascene etch processing, but is subsequently sacrificed during the metal CMP, allowing the silicon nitride layer to act as a the CMP hard mask to protect the low-k material. In this way, delamination of the low-k material is prevented, and any copper-contaminated silicon dioxide material is removed.

BRIEF DESCRIPTION OF THE DRAWING FIGURES

The subject invention will hereinafter be described in conjunction with the appended drawing figures, wherein like numerals denote like elements, and:

DETAILED DESCRIPTION OF PREFERRED EXEMPLARY EMBODIMENTS

Figure 1A:
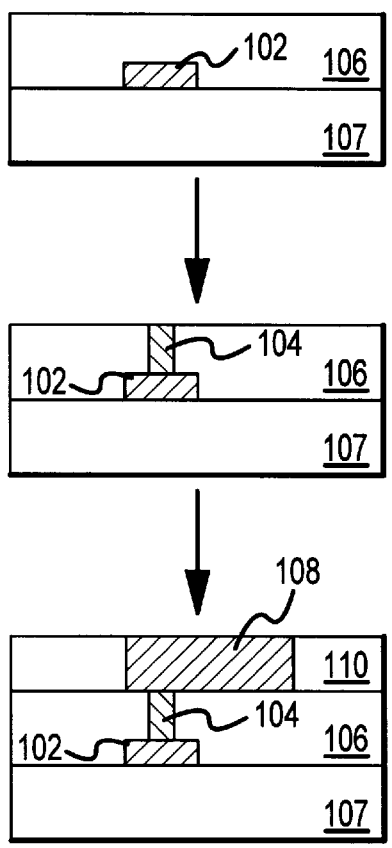
FIG. 1A is a diagrammatic illustration of a conventional single damascene interconnect process.
Figure 1B:
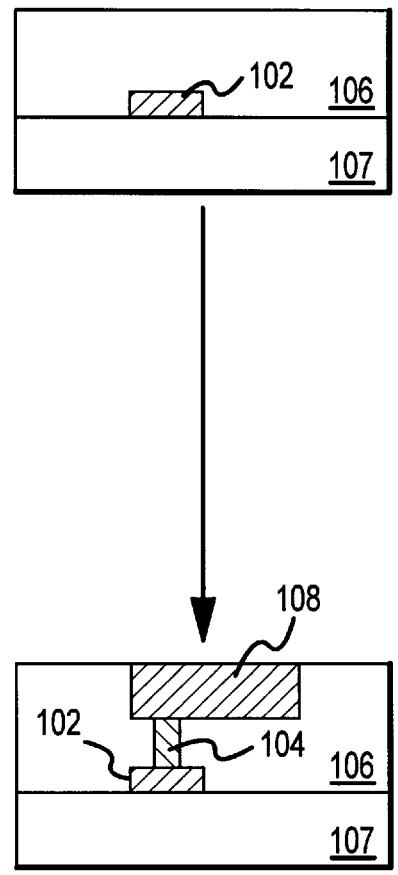
FIG. 1B is a diagrammatic illustration of a conventional dual-damascene interconnect process.
Figure 2A:
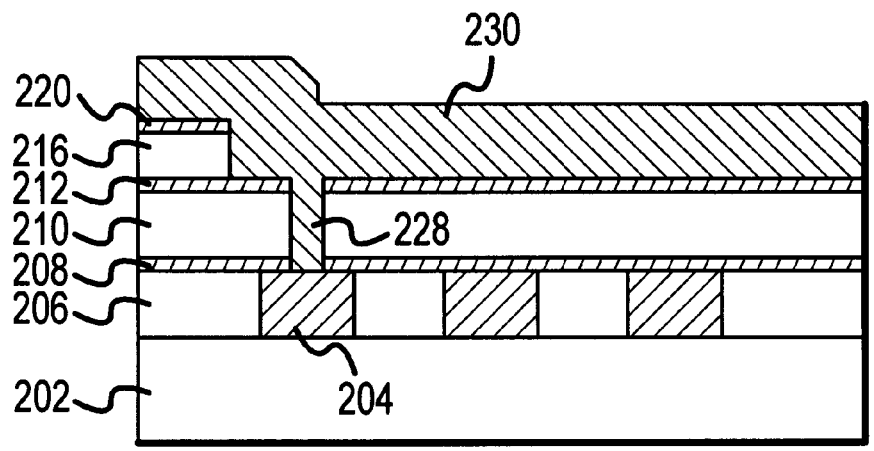
FIGS. 2A–2B depict cross-sectional views corresponding to a prior art dual damascene process before and after metal CMP respectively.
Figure 2B:
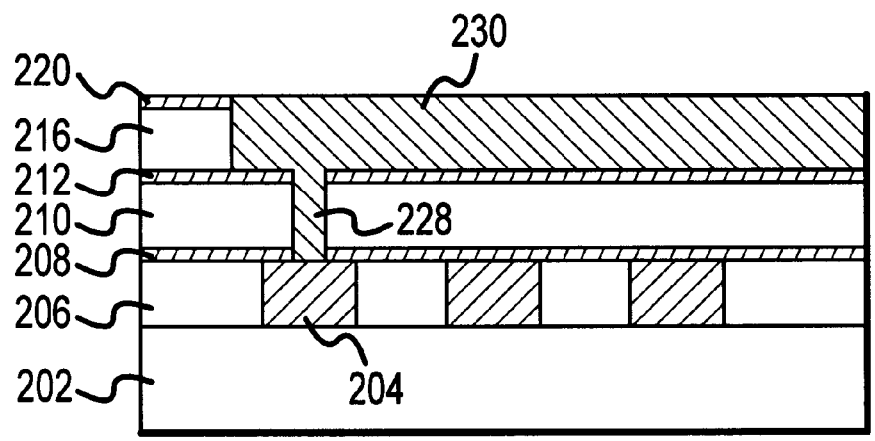

An interconnect fabrication process in accordance with various aspects of the present invention utilizes a dual-damascene approach with a CMP hard mask exhibiting excellent erosion resistance. Briefly, referring momentarily to FIG. 3J, a first hard mask layer 318 and a second hard mask layer 320 are employed. Hard mask layer 320, which protects hard mask layer 318 during various intermediate etch steps, is sacrificed during subsequent CMP processing. Thus, delamination of the low-k material is prevented, and any copper-contaminated material in hard mask layer 320 is removed.

More particularly, referring now to FIGS. 3 and 4, an exemplary dual damascene process in accordance with the present invention will now be described. In this regard, it should be understood that the illustrated process may include more or less steps or may be performed in the context of a larger processing scheme.

Initially, at Step 402, the first level metal (or, generally, a conductor) is obtained. That is, a first metal wiring pattern 304 and dielectric 306 are formed on substrate 302 (see FIG. 3A). This step may be performed through a variety of techniques. In an exemplary embodiment, a damascene process is used in which dielectric 306 (e.g., silicon dioxide or a low-k dielectric) is patterned, etched, and filled with metal 304. This is followed by a suitable CMP process to remove excess metal from the top surface of dielectric 306. Metal 304 suitably consists of a layer or layers of various conductive materials, including, for example, titanium, titanium nitride, tantalum, tantalum nitride, tungsten nitride, aluminum, aluminum-copper alloys, gold, copper, silver, tungsten, or any other suitable conductive material. In an exemplary embodiment, metal 304 comprises a layer of copper deposited using a suitable technique and accompanied by one or more barrier and seed layers (described in further detail below).

Substrate 302 includes any suitable substrate material upon which or within which semiconductor devices may be formed. Suitable materials for substrate 302 include, for example, group IV semiconductors (i.e., Si, Ge, and SiGe), group III-V semiconductors (i.e., GaAs, InAs, and AlGaAs), and other less-conventional materials, such as SiC, diamond, and sapphire. Substrate 302 may comprise single crystal material, or may comprise one or more polycrystalline or amorphous epitaxial layer formed on a suitable base material. It will be appreciated that substrate 302 may also comprise various devices incorporated into a semiconductor material as well as interconnect structures consisting of conductive paths and various dielectrics for isolating these conductive paths.

Figure 3A:
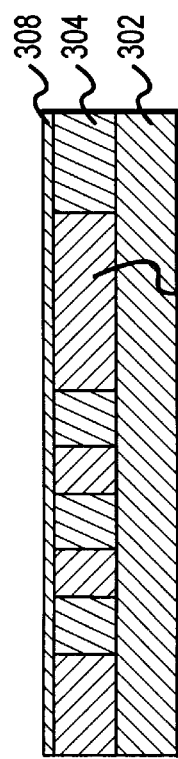
FIGS. 3A–3L depict cross-sectional views corresponding to a dual damascene process in accordance with the present invention.
Figure 4:
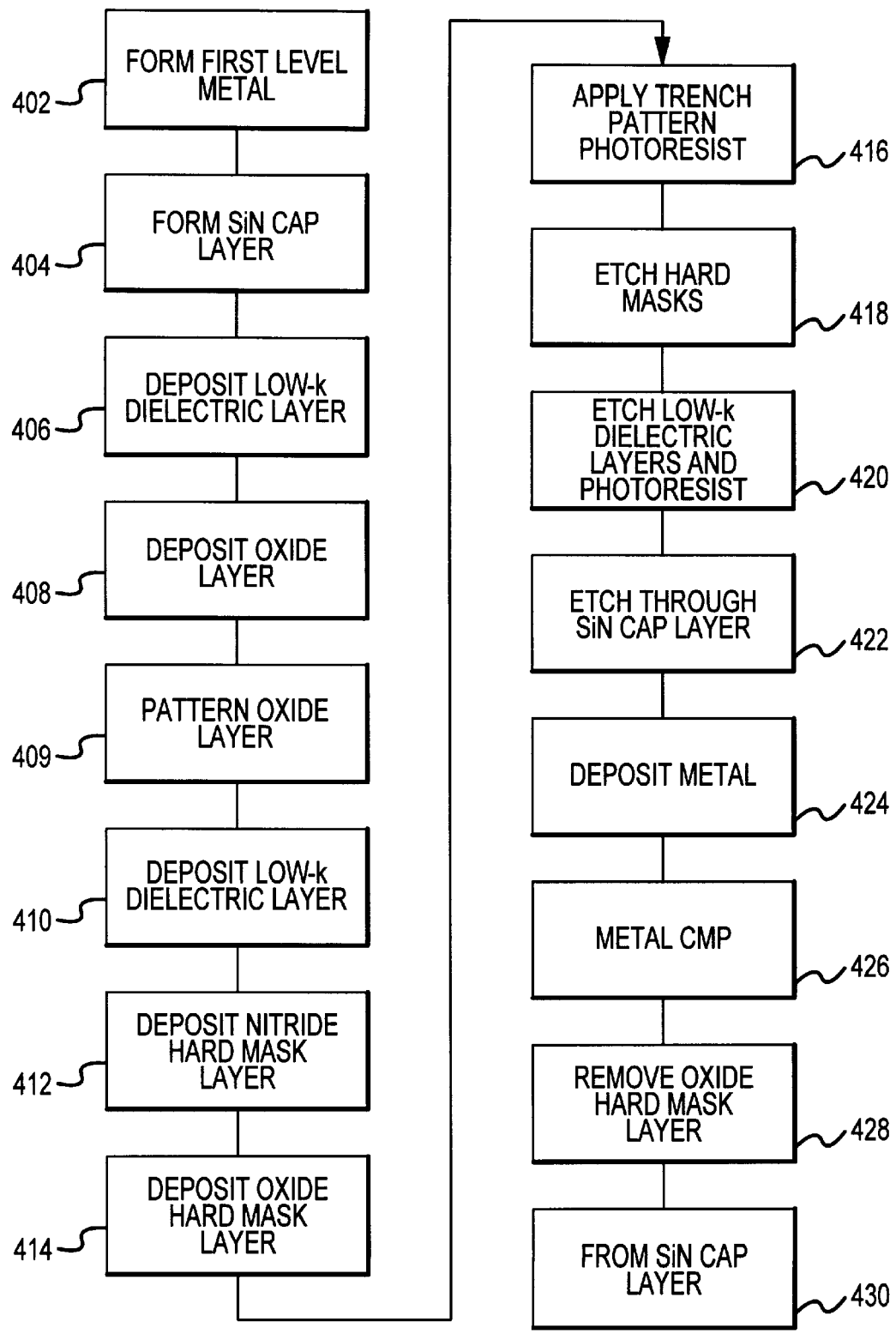
FIG. 4 is a flowchart depicting an exemplary dual-damascene process in accordance with the present invention.

Next, in Step 404, a cap layer 308 is formed on metal 304 and dielectric 306 (FIG. 3A). As mentioned above in the Background section, the purpose of this layer is to prevent diffusion of metal 304 into the overlying structures. Specifically, where metal layer 304 comprises copper, cap layer 308 preferably consists of a CVD (chemical vapor deposition) silicon nitride layer. The thickness of nitride layer 308 may be chosen in accordance with various processing parameters (for example, etch parameters described further below) and its effectiveness in preventing Cu diffusion. In the illustrated embodiment, nitride layer 308 ranges between approximately 50 to 1000 Å, preferably about 300 Å. In the case where metal 304 comprises aluminum or an aluminum alloy, a passivation cap layer 308 consisting of, for example, silicon nitride or silicon dioxide, may be employed in order to passivate the metal.

Figure 3B:
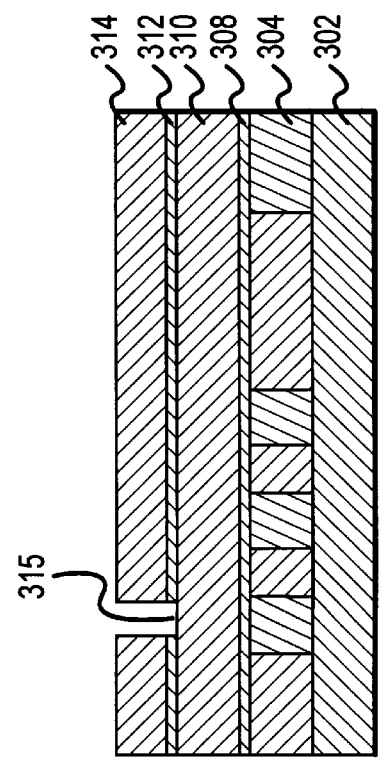

Referring now to FIG. 3B, a first low-k dielectric layer 310 is then deposited over cap layer 308 (Step 406). Low-k layer 310 preferably comprises one or more layers of organic low-k materials, for example: polyimide, poly(arylethers), parylene, benzocyclobutene (BCB), polytetrafluoroethylene, and the like. In the illustrated embodiment, dielectric layer 310 thickness is about 0.3–1.0 microns. In an alternate embodiment, low-k layer 310 comprises an inorganic dielectric material, for example, porous silicon dioxide, silsesquioxane, or fluorinated silicon oxide. It will be appreciated that, as described further below, using such materials necessitates altering the illustrated process flow.

With continued reference to FIG. 3B, a dielectric layer 312 is then deposited over low-k layer 310 (Step 408). As described below, this layer, which receives the via pattern, will eventually serve as an etch stop during subsequent etch processes. In this regard, dielectric layer 312 may comprise a variety of dielectric materials; for example, silicon dioxide, silicon oxynitride, aluminum oxide, silicon carbide, and the like. In a preferred embodiment, dielectric layer 312 comprises a plasma-enhanced CVD (PECVD) layer of silicon dioxide approximately 100 Å–1000 Å thick, although other cap materials and thicknesses may be used.

In Step 409, a via pattern 315 is formed in dielectric layer 312. Patterning Step 409 may be performed in conjunction with a variety of known lithographic techniques, for example, conventional optical lithography (including, for example, I-line and deep-UV), X-ray, E-beam lithography, and plasma etch techniques. In a preferred embodiment, a layer of photoresist 314 is deposited and patterned using a suitable lithographic method. The photoresist layer 314 is then removed using a suitable plasma strip technique, for example, low-pressure, directional etch in an oxygen-based plasma.

Figure 3C:
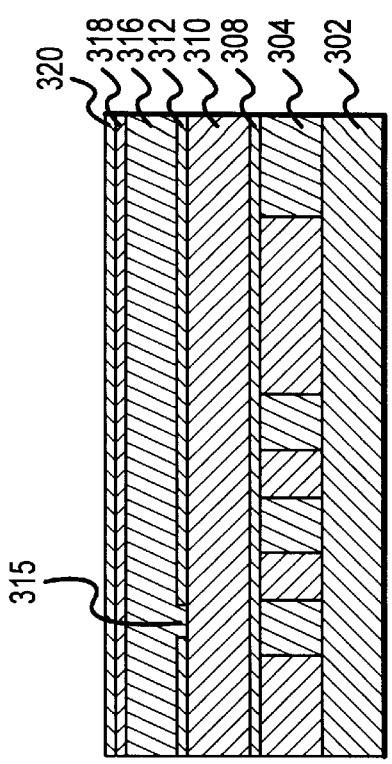
Figure 3D:
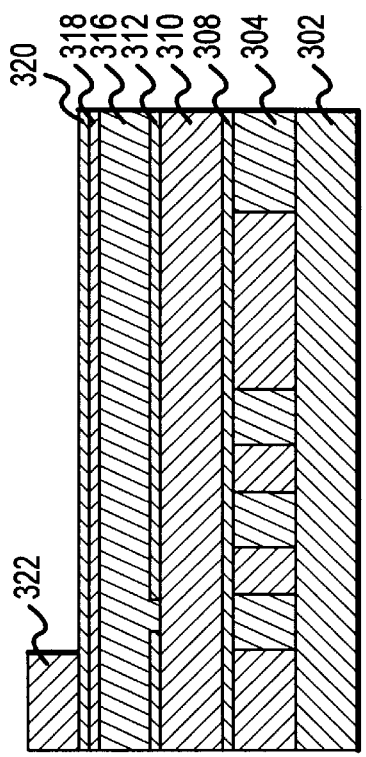
Figure 3E:
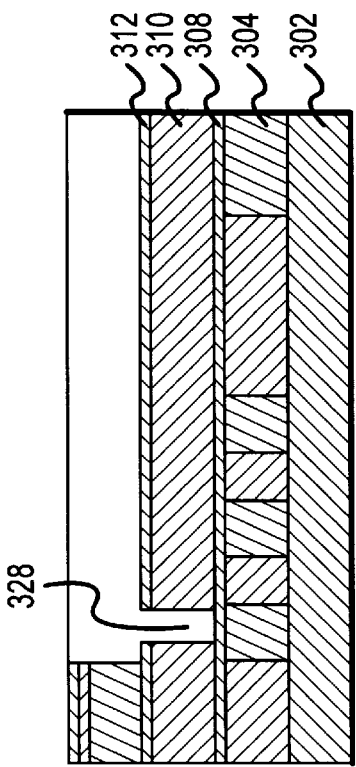

Referring now to FIG. 3C, Step 410 involves deposition of a second low-k dielectric layer 316. As with layer 310, layer 316 may comprise a variety of low-k dielectric materials. In the illustrated embodiment, low-k layer 316 comprises one of the low-k organic materials listed above having a thickness of about 0.3 to 1.0 microns, preferably about 0.5 microns.

Figure 5:
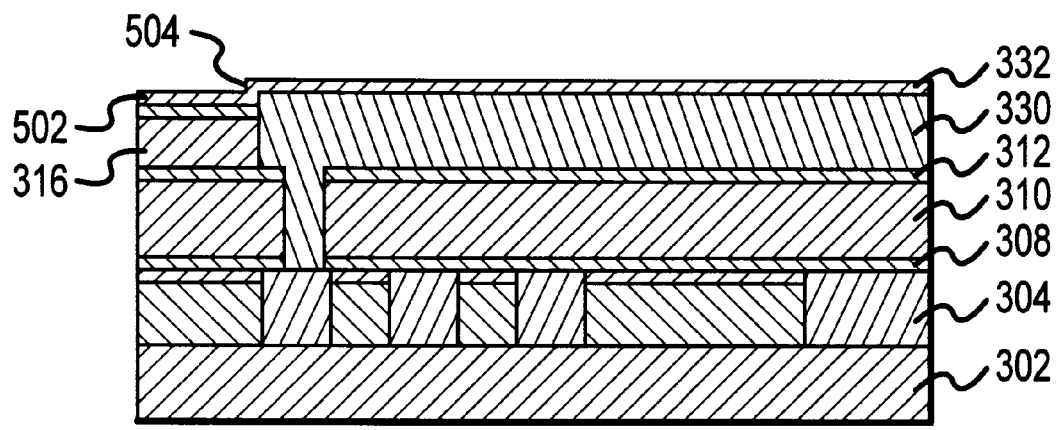
FIG. 5 depicts a cross-sectional view of an alternate embodiment of the present invention.

After deposition of low-k layer 316, a pair of hard mask layers 318 and 320 are formed. A first hard mask layer 318 is deposited in Step 412, and a second hard mask layer 320 is deposited on layer 318 in Step 412. Hard mask layer 318 preferably comprises a material that will exhibit high erosion resistance during the subsequent metal CMP (e.g., silicon nitride), and hard mask layer 320 preferably comprises the same material used for etch stop layer 312 (e.g., silicon dioxide). In a preferred embodiment, hard mask layer 318 comprises a PECVD layer of silicon nitride ranging in thickness from about 300 to 1000 Å, preferably about 500 Å. Mask layer 320 preferably comprises a layer of silicon dioxide with a thickness of approximately 100 Å to 1000 Å, preferably about 500 Å. In an alternate embodiment, the first hard mask layer 318 comprises a "stack" of two or more dielectric layers, the purpose and advantages of which are discussed more filly below in conjunction with FIG. 5.

Having deposited the pair of hard mask layers 318 and 320, the trench pattern is formed using a suitable lithographic technique (Step 416). In a preferred embodiment, referring now to FIGS. 3D and 3E, a photoresist layer 322 is deposited and patterned in the conventional manner, and portions of hard mask layers 318 and 320 are removed using a suitable etch process. In a preferred embodiment, a plasma etch process—for example, using a conventional fluorocarbon-based plasma —is used to remove the hard mask layers while leaving low-k material substantially intact. The typical carbon-fluoride-based etch chemistry usually exhibits a reasonable etch selectivity between the hard masks and the low-k material.

Figure 3F:
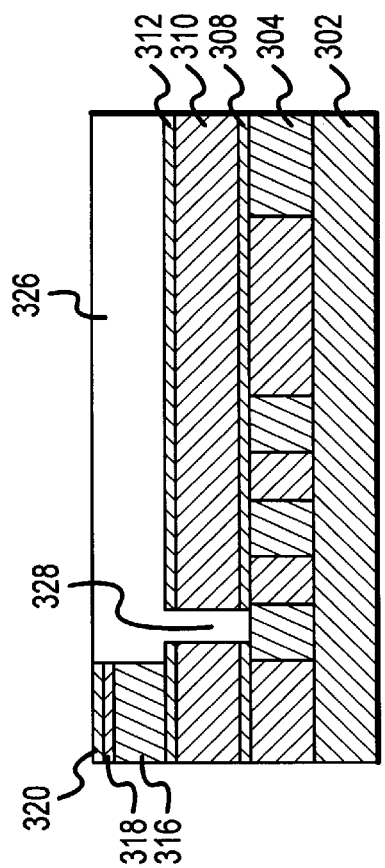
Figure 3G:
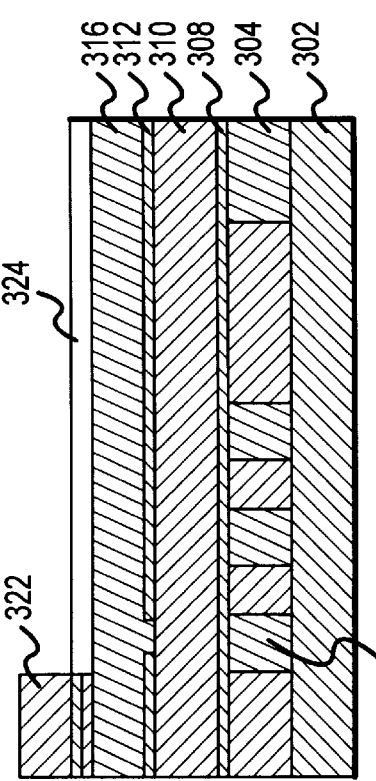

Next, in Step 420, low-k layer 316 is etched to define the trench region 326 (FIG. 3F). In a preferred embodiment, wherein low-k layer 316 comprises an organic material, an oxygen-based plasma etch process is performed whereby the photoresist 322 is removed and the low-k layer 316 is etched using a single plasma processing step. Dielectric layer 312 suitably acts as an etch stop to control the depth of trench 326. As shown in FIG. 3G, etching continues through low-k layer 310 such that via 328 is formed. Layer 312 acts as a protection layer for the low-k layer 310 during the via etch process. The oxygen-based plasma via etch terminates at layer 308.

Figure 3H:
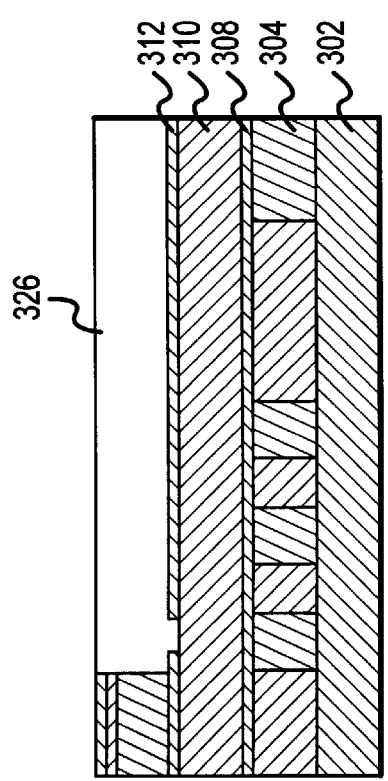

Next, in Step 422, cap layer 308 is etched away at the bottom of via 328 (FIG. 3H). A suitable etch process is chosen such that the cap layer 308 material is etched faster than hard mask layer 320, low-k layer 310, low-k layer 316, and dielectric layer 312. In the illustrated embodiment, a conventional fluorocarbon-based plasma etching process is employed.

In an alternate embodiment wherein an inorganic low-k material such as porous silicon dioxide, silsesquioxane, or fluorinated silicon oxide is used, it is advantageous to employ a different material for layer 312 than that used for the low-k materials listed above. Specifically, a layer comprising, for example, silicon nitride may be used in such a context as it exhibits a high etch selectivity with respect to these classes of materials. In such a case, the process flow would vary from that shown in the figures. More particularly, FIGS. 3F–3H would be altered in at least two ways. First, layer 312 would be removed during etching of barrier layer 308 at the bottom of via 328. (thus removing the relatively high dielectric constant material). Second, photoresist material 322 would remain over the top surface of the structure during via etching, and would be removed shortly thereafter.

As should now be apparent, a key aspect of the present invention lies in the relationship between the materials used for the various layers and the etch chemistries used for selectively removing these layers. That is, during the processes set forth above, the hard-mask layers (320 and 318), the etch stop layer (312), the cap barrier layer (308), and the low-k layers (310 and 316) are selectively etched with respect to one or more of the remaining structures. In a preferred embodiment, the following materials are used: silicon nitride for cap barrier layer 308 and hard mask layer 318; an organic low-k dielectric for dielectric layers 310 and 316; and silicon dioxide for dielectric layer 312 and hard mask layer 320. Various oxygen-based and fluorocarbon-based etch chemistries are known for fine tuning etch selectivity between these materials. Those skilled in the art will appreciate that the present invention may be practiced using other combinations of materials and etching methods. Many sources of information are available regarding the etch chemistries for these and other materials. See, for example, Givens et al., *Selective dry etching in a high density plasma for 0.5 μm complementary metal-oxide-semiconductor technology*, J. Vac. Sci. Technol. B, 427 (Jan/Feb 1994).

Figure 3K:
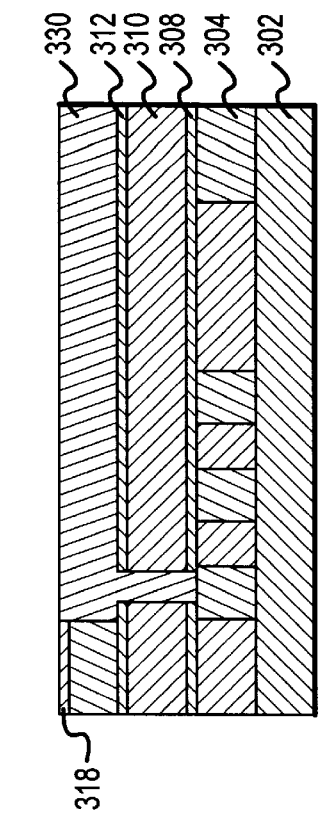
Figure 3L:
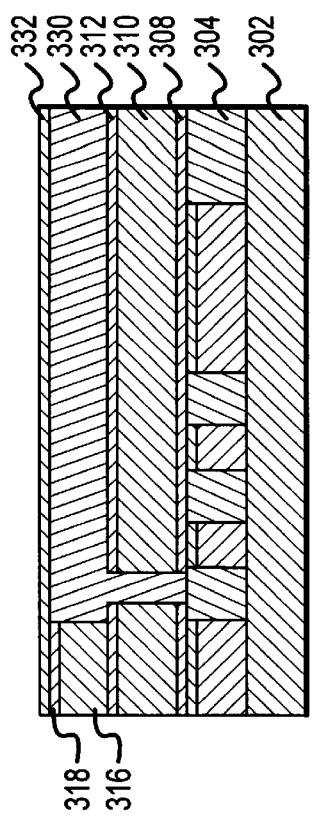
Figure 3I:
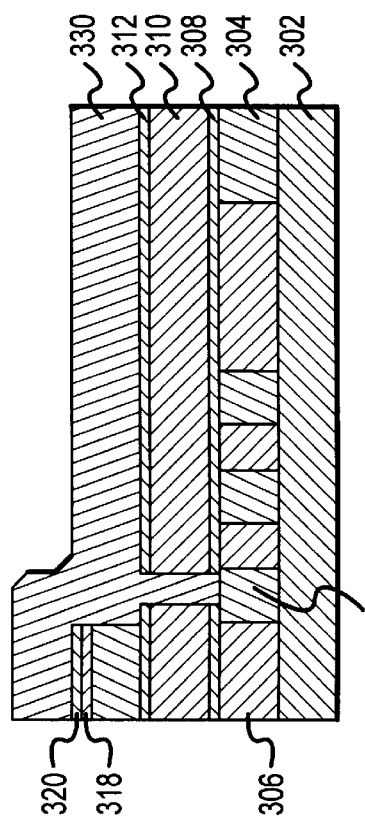

Referring now to FIG. 3I, Step 424 involves depositing bulk metal 330 within the previously formed vias and trenches (e.g., via 328 and trench 326 shown in FIG. 3H) such that metal 330 makes electrical contact with previous level metal (or conductor) 304. Metal 330 suitably consists of a layer or layers of various conductive materials, including, for example, titanium, titanium nitride, tantalum, tantalum nitride, tungsten nitride, aluminum, aluminum-copper alloys, gold, copper, silver, tungsten, or any other suitable conductive material. In an exemplary embodiment, metal 220 comprises copper deposited using electrochemical deposition (or "electroplating"). Alternatively, other deposition techniques such as CVD may be used.

Many commercial tools are suitable for the copper-electroplating step, including, for example, the EQUINOX tool manufactured by Semitool and the SABRE tool manufactured by Novellus. Such a system suitably employs a $CuSO_4$-based bath at room temperature using a DC or pulse current waveform control.

In an exemplary embodiment employing electroplating of copper, a barrier layer and a copper seed layer of Cu are deposited prior to forming bulk copper layer 330. The seed layer helps in delivering electron current uniformly on the wafer for initiation of uniform electroplating. The barrier and copper seed layers are suitably formed using ion-metal plasma (IMP) or hollow-cathode-magnetron (HCM) sputtering deposition for better bottom and sidewall coverage. Alternatively, the barrier/copper seed layers can be deposited by other PVD techniques or CVD techniques. In an exemplary embodiment, the barrier layer is approximately 250 Å thick, and the copper seed layer is approximately 1200 Å thick.

The adhesion/wetting/barrier layer (not shown) may consist of a variety of materials, for example, titanium, titanium nitride, tantalum, tantalum nitride, tungsten nitride, TiSiN, TaSiN, CoWP, tungsten, and/or molybdenum. In an exemplary embodiment, the adhesion/barrier layer suitably comprises a Ta or TaN film deposited using IMP or HCM sputtering at a temperature of less than approximately 350° C. The copper seed layer is suitably deposited by IMP or HCM sputtering at a temperature of less than approximately 100° C.

Figure 3J:
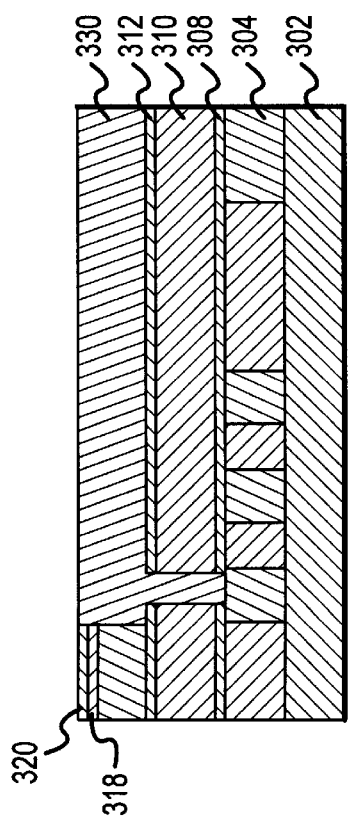

Referring now to FIG. 3J, the excess metal 330 and corresponding adhesion/wetting/barrier layers on the field are removed in Step 426, forming a substantially planar top surface. In an exemplary embodiment, this step is performed using a conventional CMP process. In the copper metallization context, a suitable CMP slurry consists, for example, of any one of the following combinations: hydrogen peroxide and alumina; ammonium hydroxide and alumina; or nitric acid and alumina. This process can be performed using a conventional polyurethane pad, for example, the IC1000 and IC1400 pads manufactured by Rodel.

During metal CMP, layer 320 acts—to a certain extent—as a hard mask. As mentioned earlier, however, the silicon dioxide material used for hard mask 320 tends to erode quickly. In prior art processes this rate of erosion is unsatisfactory, and tends to result in catastrophic delamination of the low-k layers. In the context of the present invention, however, the second hard mask layer 318 (preferably silicon nitride) provides a significantly more effective "back-up" polish-stop. As is known in the art, the rate of erosion for silicon nitride is significantly less than that of silicon oxide in a CMP context. As such, it is of little concern that layer 320 experiences erosion. Indeed, in Step 428 of the illustrated embodiment, this "weak" hard-mask layer is intentionally removed using any suitable technique, e.g., a conventional CMP oxide buff step (FIG. 3K). As is known in the art, oxide buffing involves lightly polishing the subject dielectric. This buffing step also helps to remove any copper contamination that may have diffused into or is otherwise associated with layer 320 as the result of the copper CMP process. Buffing can be performed in a number of ways, e.g., using DI water or a conventional silicon dioxide CMP slurry. In an alternative embodiment, this dielectric removal step is not performed.

Finally, in Step 430, a cap layer 332 is formed as shown in FIG. 3L. The primary purpose of this layer is to passivate the metal lines and/or to prevent diffusion of the metal into surrounding structures. Specifically, where metal layer 330 comprises copper, cap layer 332 preferably consists of a CVD silicon nitride layer. The thickness of nitride layer 332 may be chosen in accordance with various processing parameters (for example, etch parameters described above) and its effectiveness as a barrier to copper. In the illustrated embodiment, nitride layer 332 has a thickness of about 50 Å to 1000 Å, preferably about 300 Å.

In an alternate embodiment, layer 318 may itself comprise multiple layers of dielectrics. For example, it may be advantageous (for the purpose of, inter alia, enhancing adhesion or increasing mechanical integrity) for layer 318 to include a layer of silicon dioxide beneath layer 318. The resulting structure would then include an intermediate layer (not shown) of silicon dioxide approximately 50 Å to 1000 Å thick between layers 316 and 318. This structure would allow the relatively high dielectric constant material used for layer 318 to be etched away during a subsequent etching step. That is, referring now to FIG. 5, the resulting structure would differ from that shown previously in FIG. 3L in that the intermediate layer (or layers) 502 would remain between layers 332 and 316 (layer 318 will have been removed), and a step 504 would occur in layer 332 due to the difference between the height of conductor 330 and the combined height of dielectrics 316 and 502. That is, the top surface of conductor 330 is offset from the top surface of intermediate layer 502.

Figure 6:
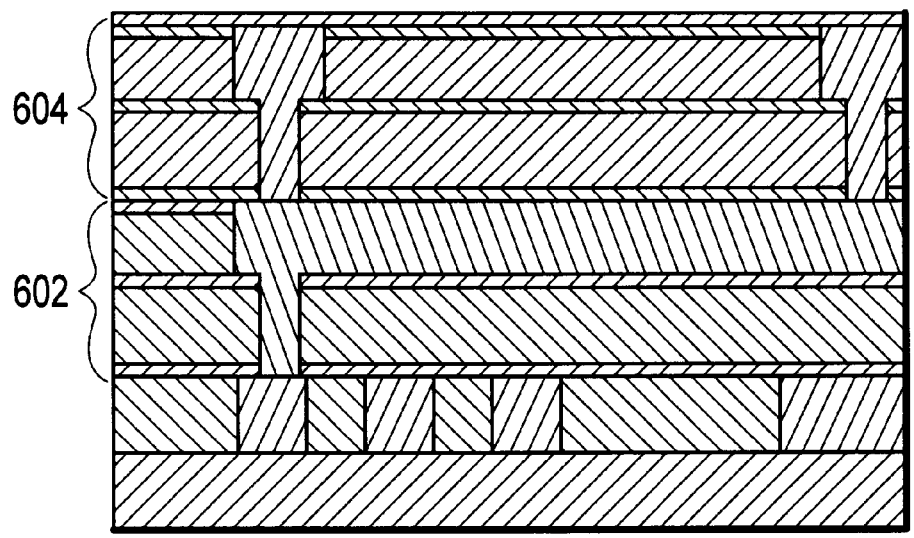
FIG. 6 depicts a cross-sectional view of a multi-layer structure in accordance with the present invention.

It will be appreciated that multiple interconnect levels may be fabricated using methods in accordance with the present invention. More particularly, it is possible to repeat Steps 406–430 to build one or more subsequent dual damascene interconnect structures upon the existing structure. For example, referring to FIG. 6, a dual damascene structure 604 has been formed on a previous dual damascene structure 602. It will be appreciated that this process may be repeated to build an arbitrary number of layers.

Although the invention has been described herein in conjunction with the appended drawings, those skilled in the art will appreciate that the scope of the invention is not so limited. Various modifications in the selection, design, and arrangement of the various components and steps discussed herein may be made without departing from the scope of the invention.

What is claimed is:

1. A method for forming a multi-level interconnect in an integrated circuit comprising a conductor, a cap dielectric layer, and a low-k dielectric layer, said method comprising the steps of:

depositing a first hard mask layer over the low-k dielectric layer;

depositing a second hard mask layer over said first hard mask layer, wherein said second hard mask layer exhibits etch-selectivity with respect to the cap dielectric layer and the low-k dielectric layer, and said first hard mask layer is resistant to polishing-induced erosion;

polishing said second hard mask layer such that said second hard mask layer is substantially removed, and said first hard mask layer is substantially intact.

2. The method of claim 1, wherein said step of depositing a first hard mask layer comprises the step of forming a layer of silicon nitride.

3. The method of claim 1, wherein said step of depositing a second hard mask layer comprises the step of forming a layer of silicon dioxide.

4. The method of claim 1, wherein said step of depositing a first hard mask layer comprises the step of depositing a plurality of dielectric layers.

5. The method of claim 1, wherein said step of depositing a first hard mask layer comprises the steps of:

forming a layer of silicon dioxide; and forming a layer of silicon nitride on said layer of silicon dioxide.

6. A method for forming an interconnect in an integrated circuit, said method comprising the steps of:

(a) providing a substantially planar layer comprising a conductor and cap dielectric layer disposed thereupon;

(b) forming a first low-k dielectric layer on said cap dielectric layer;

(c) forming an etch stop layer over said first low-k dielectric layer;

(d) patterning said etch stop layer in accordance with a via pattern;

(e) forming a second low-k dielectric layer on said etch stop layer;

(f) forming a first hard mask layer over said second low-k dielectric layer;

(g) forming a second hard mask layer over said first hard mask layer;

(h) patterning said first and second hard mask layers and said second low-k dielectric layer in accordance with a metal wiring pattern;

(i) etching said first low-k dielectric layer in accordance with said via pattern, wherein said etch stop layer exhibits etch selectivity with respect to said first and second low-k dielectric layers;

(j) etching said cap dielectric layer to expose said conductor, wherein said etch stop layer and said second hard mask layer exhibit etch selectivity with respect to said cap dielectric layer;

(k) depositing a metal-layer such that said metal layer is electrically continuous with said conductor;

(l) polishing away excess regions of said metal layer, wherein said first hard mask layer acts as a stop during polishing.

7. The method of claim 6, wherein said step of depositing a first hard mask layer comprises the step of forming a layer of silicon nitride.

8. The method of claim 6, wherein said step of depositing a second hard mask layer comprises the step of forming a layer of silicon dioxide.

9. The method of claim 6, wherein said step of depositing a first hard mask layer comprises the step of forming a plurality of dielectric layers.

10. The method of claim 9, wherein said step of forming a plurality of dielectric layers comprises the steps of:

forming a layer of silicon dioxide; and forming a layer of silicon nitride on said layer of silicon dioxide.

11. The method of claim 9, further comprising the step of substantially removing at least one of said plurality of dielectric layers prior to said step (k).

12. The method of claim 10, further comprising the step of substantially removing said layer of silicon nitride prior to said step (k).

13. The method of claim 6, wherein said providing step comprises the step of providing a copper metal layer and a silicon nitride cap layer disposed thereupon.

14. The method of claim 6, wherein said step of forming said first low-k dielectric layer comprises the step of forming a layer of material chosen from the group consisting of polyimide, polyarylether, parylene, benzocyclobutene, polytetrafluoroethylene, porous silicon dioxide, silsesquioxane, and fluorinated silicon oxide.

15. The method of claim 6, wherein said step of forming said second low-k dielectric layer comprises the step of forming a layer of material chosen from the group consisting of polyimide, polyarylether, parylene, benzocyclobutene, polytetrafluoroethylene, porous silicon dioxide, silsesquioxane, and fluorinated silicon oxide.

16. The method of claim 6, wherein said step of depositing a metal layer comprises the step of depositing a bulk layer of copper.

17. The method of claim 16, further comprising the steps of forming a barrier layer and a copper seed layer.

* * * * *